United States Patent [19]

Winzer et al.

[11] Patent Number: 5,629,578

[45] Date of Patent: May 13, 1997

[54] INTEGRATED COMPOSITE ACOUSTIC TRANSDUCER ARRAY

[75] Inventors: Stephen R. Winzer, Ellicott City; Paul J. Caldwell, Baltimore; Natarajan Shankar, Columbia; Tushar K. Shah, Sykesville, all of Md.; Keith Bridger, Washington, D.C.; Andrew P. Ritter, Surf Side Beach, S.C.

[73] Assignees: Martin Marietta Corp., Bethesda, Md.; AVX Corporation, Myrtle Beach, S.C.

[21] Appl. No.: 406,601

[22] Filed: Mar. 20, 1995

[51] Int. Cl.$^6$ .................................................. H01L 41/08
[52] U.S. Cl. ........................... 310/334; 310/337; 310/340
[58] Field of Search ........................... 310/334–337, 310/339, 348, 340, 346, 344

[56] References Cited

U.S. PATENT DOCUMENTS

| | | | |
|---|---|---|---|
| 4,404,489 | 9/1983 | Larson et al. | 310/334 |
| 4,409,510 | 10/1983 | Assenza et al. | 310/334 |
| 4,479,069 | 10/1984 | Miller | 310/334 |
| 4,523,121 | 6/1985 | Takahashi et al. | 310/334 |
| 4,638,468 | 1/1987 | Francis | 367/153 |
| 4,656,384 | 4/1987 | Magori | 310/334 |
| 4,681,667 | 7/1987 | Utsumi et al. | 204/15 |
| 4,734,608 | 3/1988 | Takoshima | 310/348 X |
| 4,819,216 | 4/1989 | Fraioli | 367/154 |
| 4,825,115 | 4/1989 | Kawabe et al. | 310/327 |
| 4,864,179 | 9/1989 | Lapetina et al. | 310/337 |
| 4,890,268 | 12/1989 | Smith et al. | 367/138 |
| 4,903,166 | 2/1990 | Galvagni | 361/321 |
| 4,950,936 | 8/1990 | Rynne et al. | 310/337 |
| 5,058,250 | 10/1991 | Turnbull | 29/25.35 |
| 5,202,703 | 4/1993 | Hoisington et al. | 346/140 |
| 5,311,095 | 5/1994 | Smith et al. | 310/334 |
| 5,329,496 | 7/1994 | Smith | 310/334 X |
| 5,329,498 | 7/1994 | Greenstein | 367/155 |
| 5,365,140 | 11/1994 | Ohya et al. | 310/328 |
| 5,381,067 | 1/1995 | Greenstein et al. | 310/334 |
| 5,381,385 | 1/1995 | Greenstein | 310/334 X |
| 5,459,368 | 10/1995 | Onishi | 310/344 X |

OTHER PUBLICATIONS

Relaxor Ferroelectric Transducers—Takeuchi et al—1990 Ultrasonics Symposium—pp. 697–705.

*Primary Examiner*—Mark O. Budd
*Attorney, Agent, or Firm*—Feix & Feix; Henry Groth

[57] ABSTRACT

An improved transducer array includes a two-dimensional array of multilayer actuators, capable of producing very high displacement with low input voltage, integrally packaged with conditioning electronics. Preferred microcomposite actuators use multiple layers of stacked electrostrictive ceramics and conductive materials. The actuators are aligned in a two-dimensional array and can be integrated with the conditioning electronics in a variety of packaging systems. A preferred packaging system is a flexible high density interconnected multi-chip module which has the integrated circuit chips disposed in a substrate, interconnection layers disposed thereon and the multilayer composite actuators disposed on the surface of the interconnection structure. The actuators in this packaged array may be optionally addressed individually or in blocks, depending on the application intended.

22 Claims, 5 Drawing Sheets

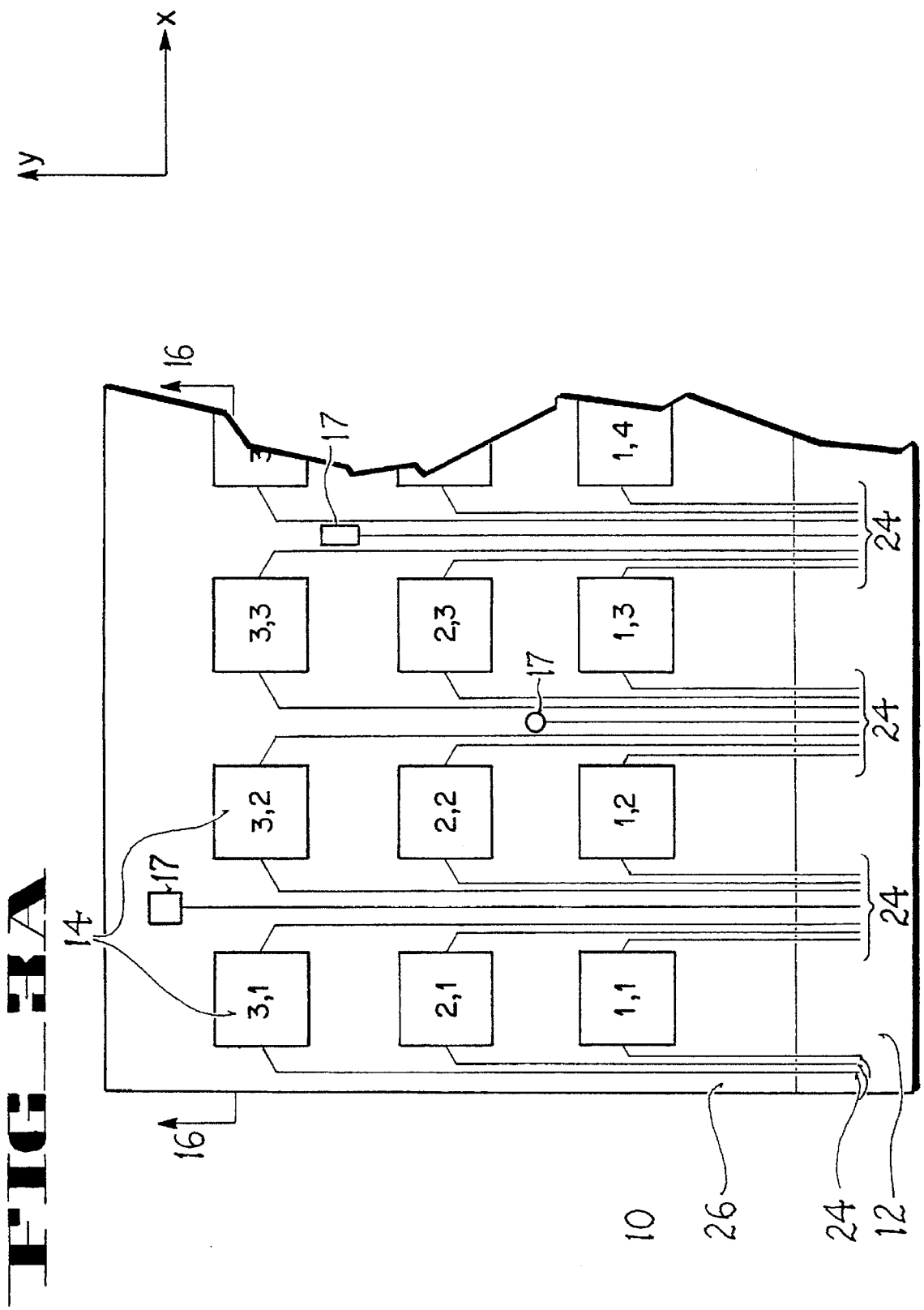

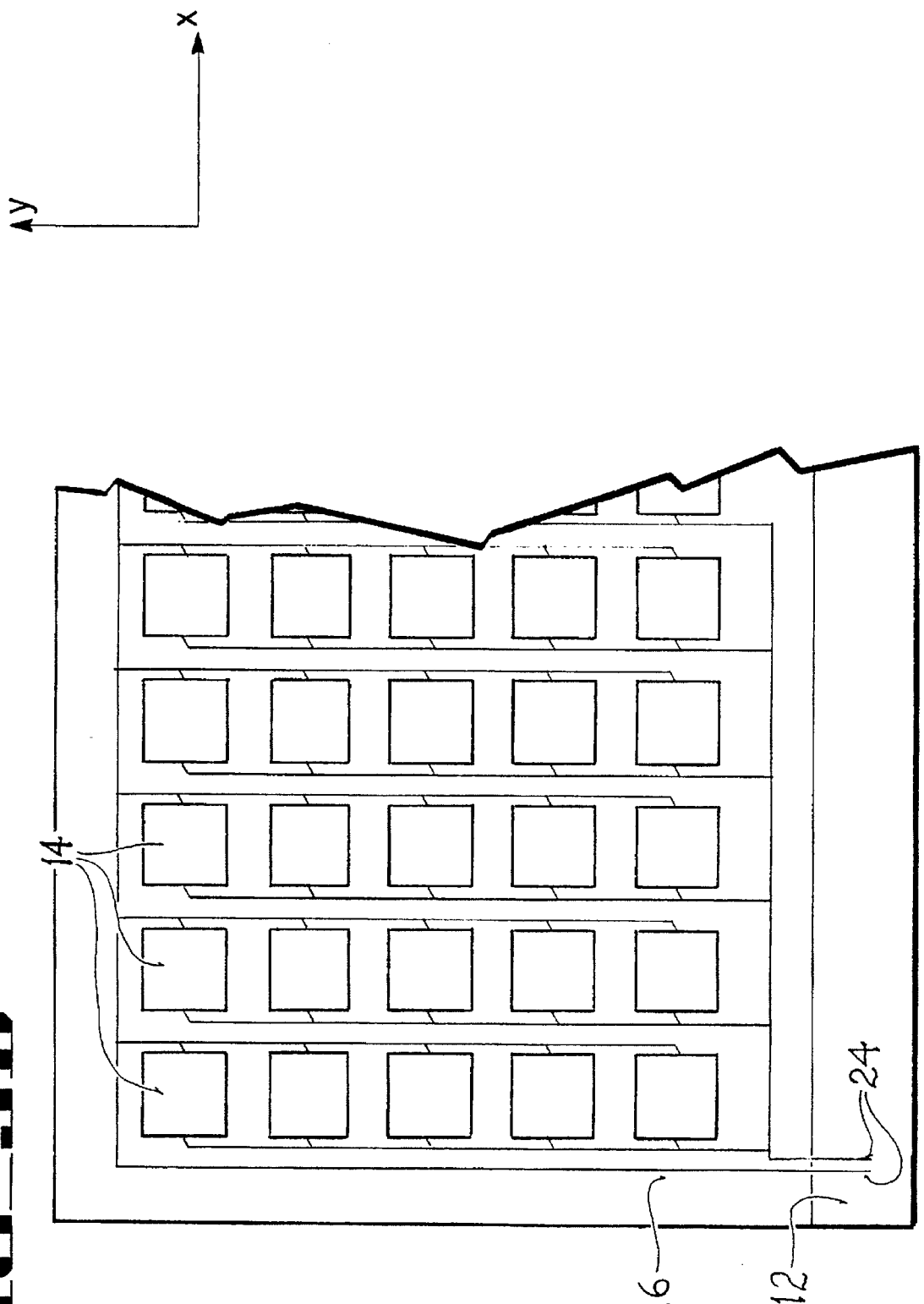

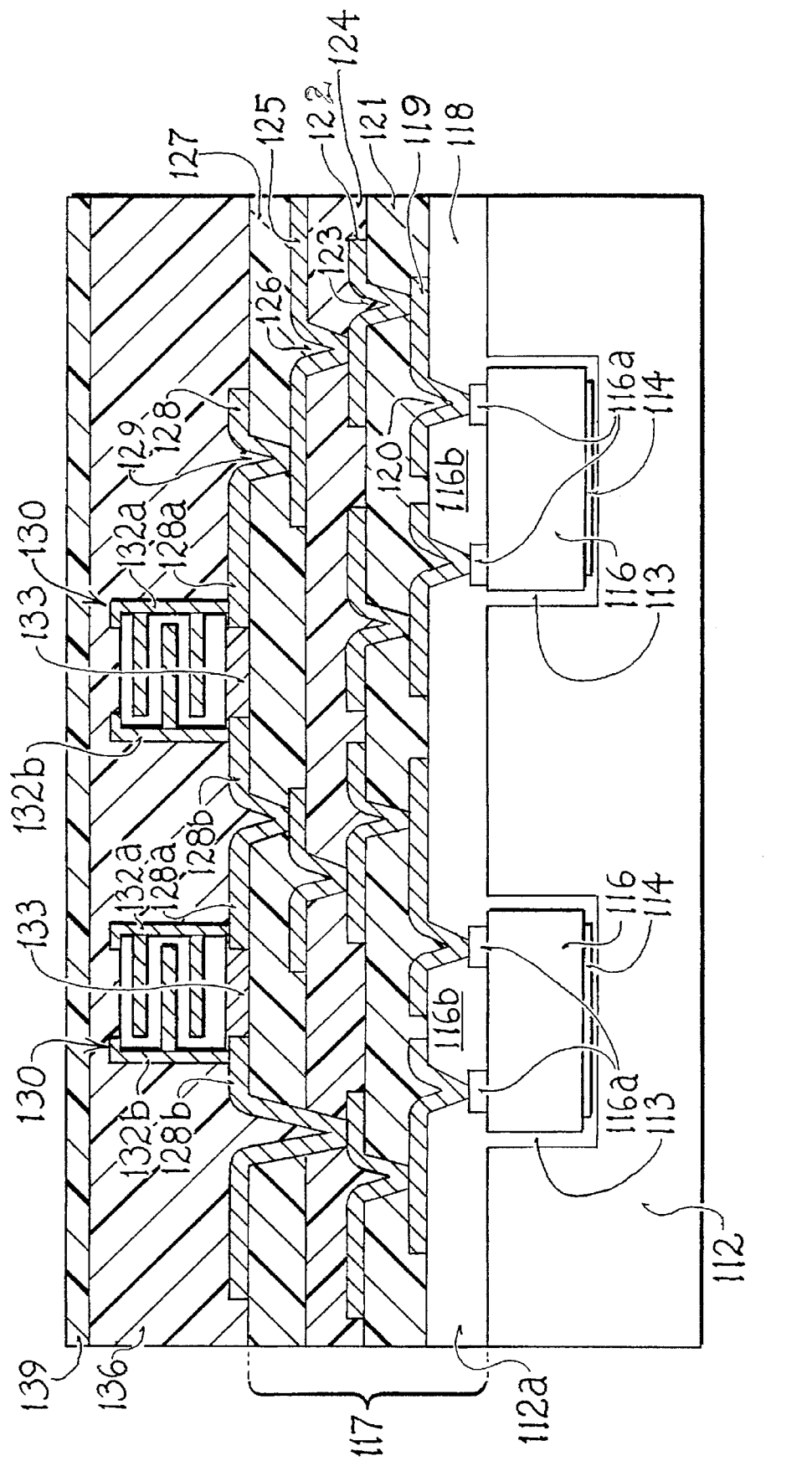

INTEGRATED COMPOSITE ACOUSTIC TRANSDUCER ARRAY

BACKGROUND OF THE INVENTION

This invention relates generally to acoustic transducers and, more particularly, to an improved composite transducer array having tunable, impedance-controllable and electronically-addressable multilayer sensor-actuators within a housing structure.

Actuating elements, whether crystals, ceramics or polymers, have been employed in a variety of devices including microphones, ultrasonic devices, accelerometers, hydrophones and oscillators. When power density is a primary goal, and the characteristic impedance of the medium is relatively high, e.g., water, ceramic actuators are typically employed. Ceramic actuators are typically either piezoelectric or electrostrictive, each of which have distinct operating characteristics. For example, piezoelectric actuators have a linear response when an electric field is applied, whereas unbiased electrostrictive materials have a quadratic response to an electric field; piezoelectric materials are polarized during fabrication so sensitivity (to pressure, strain, or electric field) is pre-set, whereas electrostrictive materials are polarized when a DC bias is applied and thus sensitivity can be varied during operation; piezoelectric materials operate below the Curie Temperature ($T_c$) and as the operating temperature approaches $T_c$, the material degrades in a non-recoverable manner, whereas electrostrictive materials operate within a temperature range close to $T_c$ and above. Therefore, although both piezoelectric and electrostrictive actuators do change shape when an electrical field is applied they are very different and both have distinct advantages and disadvantages. Commonly assigned U.S. Pat. No. 5,023,032, entitled "Electrostrictive Ceramic Material Including a Process for the Preparation Thereof and Applications Therefor", to Bailey et al., describes an electrostrictive actuator composition which has both a relatively wide operating temperature range and a high electrostrictive constant and therefore produces increased strain (displacement) over prior art compositions. This patent, including all references contained therein, is hereby incorporated by reference in its entirety.

Generally speaking, the electrostrictive effect in an actuator comes from the direct attraction and repulsion of anions and cations in the crystal lattice, resulting in a physical distortion of the lattice responsive to the application of an external electric field. This lattice distortion causes a displacement, or strain, in the material. Stated quantitatively, the strain in electrostrictive materials is proportional to the electrostrictive coefficient multiplied by the square of the electric polarization. Therefore, the strain is directly related to both the square of the dielectric constant and the applied electric field. As stated above, the strain in piezoelectric materials is equal to the piezoelectric coefficient multiplied by the electric field.

Ceramic actuators typically have electrodes on opposed top and bottom surfaces for applying the electric field. Once the actuating material is chosen, e.g., piezoelectric, electrostrictive, etc., the principle way to increase the displacement is to increase the amount of actuator material between the electrodes. However, as the distance between the electrodes is increased the electric field per voltage unit decreases. Thus most ceramic actuators must work at extremely high voltages to both increase the amount of material between the electrodes while keeping the electric field high enough to create sufficient strain.

This dichotomy between obtaining high displacement and maintaining low voltage complicates the implementation of distinct actuating elements into a system. There have been systems having a plurality of actuators that require a high individual driving voltage, but they require the power supply and controlling electronics to be separated from the transducer assembly. For example, one of the most common uses of piezoelectric elements is in underwater sonar equipment in which sonar transducers are stimulated by electric signals to emit sonar (acoustic) signals which radiate out from the transducers. The sonar signals are reflected from underwater objects and the reflected signals are received by the transducers, which produce electrical signals carrying information about the underwater objects. The transducer assemblies consist of relatively thick ceramic plates (up to about 1 centimeter) and require drive voltages on the order of several thousand volts. Another example of implementing piezoelectric actuators in a system is in the medical imaging field. Tissues of a human body can be imaged by electrically exciting an acoustic transducer element or an array of acoustic transducer elements to generate short ultrasonic pulses that are caused to travel into the body. Echoes from the tissues are received by the acoustic transducer elements and are converted into electrical signals. These signals are amplified and processed to form a cross-sectional image of the tissues. The elements in these medical ultrasound arrays are very small because of the high operating frequencies leading to an electrical impedance mismatch problem with the three to six foot cable connecting the electronics.

RELATED ART

U.S. Pat. No. 4,868,179, entitled "Two-dimensional Piezoelectric Transducer Assembly," to Lapetina et al, teaches a specific piezoelectric transducer assembly to produce sonar signals for underwater transmission and for detecting reflected sonar signals. The assembly includes a two-dimensional planar array of piezoelectric elements disposed in an elastomer casing. The elements are coupled by way of conductors to electronic circuitry which produces electrical signals for stressing the piezoelectric elements and which processes electrical signals produced by the piezoelectric element in response to reflected acoustic signals. FIG. 1 of Lapetina et al. clearly illustrates how these systems have separated the electronics from the transducer array. Lapetina et al. also has piezoelectric transducers which are not tunable because piezoelectric transducers are polarized at the time of fabrication. Further, the array has no electrical impedance control because the capacitance is fixed by the thickness of the piezoelectric element. Additionally, Lapetina et al. is not a phased array because all the elements are connected to the same electrode and are all activated at once by the same signal.

U.S. Pat. No. 5,329,498, entitled "Signal Conditioning and Interconnection for an Acoustic Transducer," to Greenstein, teaches an ultrasonic device having an array of acoustic transducers integrated with a bundle of parallel integrated circuit chips having active circuitry. Greenstein has integrated the electronics and transducers, however, the completed module is very thick, i.e., inflexible, and utilizes low power piezoelectric transducers which have limited usefulness in underwater and medical applications. Greenstein also teaches placing a backing member made of a material for attenuating acoustic waves to provide Z-axis conduction of signals from the parallel IC chips to individual piezoelectric elements. Again, because Greenstein only teaches utilizing piezoelectric elements, it is not tunable and has no electrical impedance control.

The art of multi-chip modules (MCM's) is significantly more advanced in the area of packaging. One of the most advanced packaging systems in multi-chip modules includes a high density interconnect (HDI) structure. High density interconnected packages, used in the fabrication of high density interconnect multi-chip modules, have many advantages in the compact assembly of MCMs. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, are prepared. The bottom of the cavity is then provided with a thermoplastic adhesive layer, which may preferably be a polyetherimide resin (such as ULTEM® 6000 resin, available from the General Electric Company, Fairfield, Conn.), or an adhesive composition such as is described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film, which may be "KAPTON®" polyimide, (available from E. I. du Pont de Nemours Company, Wilmington, Del.), of a thickness of approximately 0.0005–0.003 inches (approx. 12.5–75 microns), is pre-treated by reactive ion etching (RIE) to promote adhesion. The substrate and chips must then be coated with ULTEM® 1000 polyetherimide resin or another thermoplastic adhesive to adhere the KAPTON® resin film when it is laminated across the tops of the chips, any other components and the substrate. Thereafter, via holes are provided (preferably by laser drilling) through the KAPTON® resin film, and ULTEM® resin layers, at locations in alignment with the contact pads on the electronic components to which it is desired to make contact. A multi-sublayer metallization layer, with a first sublayer comprising titanium (approximately 1000Å) and a second layer comprising copper (approximately 2000Å), is sputter deposited over the KAPTON® resin layer and extends into the via holes to make electrical contact to the contact pads disposed thereunder. The sputtered copper provides a seed layer for copper electroplating (3 to 4 microns thick). A final layer of titanium (1000Å) is sputter deposited to complete the Ti/Cu/Ti multilayer metallization. This metallization layer is patterned to form individual conductors using photoresist and etching.

Additional dielectric and metallization layers are provided as required in order to provide all of the desired electrical connections among the chips. The high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,844, entitled "Area-Selective Metallization Process" by H. S. Cole, et al.; U.S. Pat. No. 5,169,678, entitled "Locally Orientation Specific Routing System" by T. R. Haller, et al.; U.S. Pat. No. 5,108,825, entitled "An Epoxy/Polyimide Copolymer Blend Dielectric and Layered Circuits Incorporating It" by C. W. Eichelberger, et al; U.S. Pat. No. 5,300,812, entitled "Plasticized Polyetherimide Adhesive Composition and Usage" by Lupinski et al; and U.S. Pat. No. 5,206,712, entitled "Building Block Approach to Microwave Modules" by Kornrumpf et al. Each of these Patents and Patent Applications, including the references contained therein, is hereby incorporated in its entirety by reference.

Consequently, it is desirable to provide an array of tunable and impedance-controllable microcomposite actuators, capable of working as a phased array in a variety of frequency domains, integrated with electronics in a compact and easily fabricated structure.

OBJECTS OF THE INVENTION

A primary object of the present invention is to create an easily fabricated, and integrated, composite transducer array of electronically-addressed microcomposite actuators capable of sensing incoming acoustic or vibration energy and/or producing outgoing acoustic or vibration energy.

SUMMARY OF THE INVENTION

Briefly, according to the present invention, an acoustic transducer array includes a two-dimensional array of multilayer actuators integrated with controlling electronics in a small package, where each actuator converts electrical energy to mechanical motion and reciprocally converts mechanical motion to electrical energy, and where each actuator is capable of producing very high displacement with low voltage requirements. For example, the microcomposite actuators of the present invention are fabricated with multilayers of piezoelectric or electrostrictive ceramics and conductive materials. These actuators have thicknesses between about 20 microns and about 200 microns, and operate at voltages between about 10 and about 150 volts, which is far below the 1000 volts or so mandated by prior art systems.

These actuators are aligned in a two-dimensional array and can be easily integrated with the conditioning electronics in a variety of packaging systems. In a first embodiment, the packaging system is a printed circuit board, with the electronics and the actuators integrally disposed on the printed circuit board. The actuators may be optionally addressed individually or in blocks, depending on the intended use of the transducer array. The preferred packaging system is a high density interconnected multi-chip module which has the integrated circuit chips disposed in a substrate, the interconnection layers disposed thereon and the multilayer composite actuators disposed on a top surface of the interconnection structure. Again, the high density interconnected actuators may be optionally addressed individually or in blocks, depending on the final needs of the array.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which

FIG. 3a and 3b are top views of a plurality of microcomposite actuators electrically connected to a printed circuit board and addressed individually and in blocks, respectfully; and FIG. 4 is a cross-sectional view of a plurality of microcomposite actuators electrically connected to high density interconnected multi-chip module.

DETAILED DESCRIPTION

Figure 1:
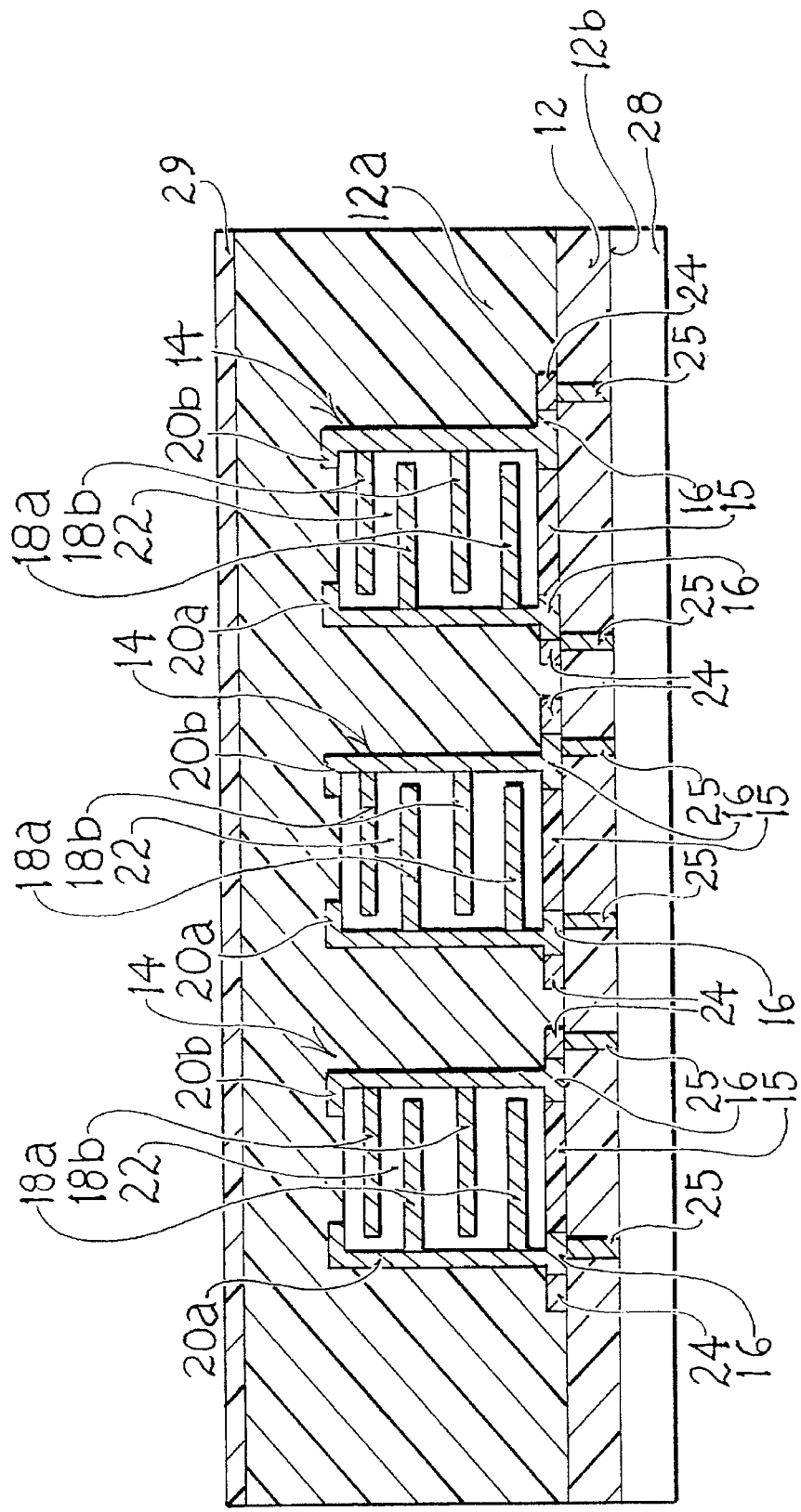
FIG. 1 is a cross-sectional view of a plurality of microcomposite actuators electrically connected to a printed circuit board integrated with electronics.

Referring initially to FIG. 1, an assembly 10 of microcomposite actuators 14, disposed on a base 12 is shown. Base 12 can be a broad class of materials which are capable of supporting a plurality of microcomposite actuators 14, and at the same time supporting and allowing electrical interconnection through a printed circuit. Base 12 may comprise electrically insulative materials such as ceramics, e.g., alumina, composite materials, polymers, and the like, and preferably comprises a standard printed circuit board or other commonly used substrate for electronic packaging. As indicated, an electronics subportion 28 is truly integrated with base 12 and actuators 14. Electronics subportion 28 may be fabricated upon a base surface 12b opposite to that surface 12a upon which actuators 14 are fabricated (as shown), or alternatively, may be fabricated on the same side (12a) as actuators 14. Electrical leads 24, laid down onto base 12, form the printed circuit and comprise the means for electrically connecting a plurality of actuators 14 and electronics subportion 28. Leads 24 may comprise any electrically conductive material and preferably comprise copper; conductive vias 25 may connect leads 24 and electronics subportion 28. Variations in the conductive material, or in the design of the printed circuit, will be known to those skilled in the art of printed circuit board technology.

Electronics subportion 28 may comprise simple analog devices, analog to digital converters, digital signal processing chips, preamplifiers, integrated circuit-based power supplies, as well as the support electronics for these circuits. Common to all devices are preamplifiers and signal conditioning electronics. One advantage of implementing the array of transducers and electronics subportion 28 in very close proximity is that losses in transmitting signal from, and power to the array, are minimized, thereby allowing optimization of signal to noise ratio and minimization of required power to run assembly 10.

Actuators 14 generally comprise any material capable of actuating, or moving, when acted on by an electrical signal. By actuators (and transducers) we mean not only materials that convert electrical energy to mechanical motion (i.e., drive) but also those that reciprocally convert mechanical motion to electrical energy (i.e., sense). As each actuator is acted upon by an electric field, the attraction and repulsion of anions and cations in the crystal will cause the material to move, or actuate, in one (Z) axis, i.e., up and down. If actuators 14 are not securely bonded to base 12 they will move both up and down simultaneously. To maximize the "up" motion and therefore the signal output of actuators 14, the bottom of each actuator should be securely bonded to base 12. Therefore, actuators 14 may optionally be bonded to base 12 with a broad class of insulative adhesives 15, capable of bonding actuators 14 to base 12. Suitable materials are epoxies, silicones, polyimides, polyetherimides, polyurethanes, thermoplastic adhesives (e.g., acrylic polyesters), and the like, with epoxy being the preferred material.

Actuating, or active, materials generally comprise piezoelectric, electrostrictive or magnetostrictive materials, however, actuators 14 may also comprise electrostatic or electromagnetic devices (such as parallel plates or solenoids), and the like. Any of these materials or devices can be used provided they can be manufactured into an product which is amenable to high volume microelectronics processing techniques. Each of these materials is within the scope of the present invention and has certain advantages and disadvantages which dictate its specific application. For example, piezoelectric materials have the advantage of temperature stability over a wide range and therefore are primarily used as sensing elements, or, as actuators when high strain and low hysteresis are not critical, whereas electrostrictive materials have the advantage of high strain (or displacement) and are generally used in transmission. Actuators 14 may be disposed on base 12 in a variety of configurations, depending on the intended application for assembly 10. The preferred configuration of actuators is in a rectangular two-dimensional array of square actuators. The center-to-center spacing of adjacent actuators ranges from about 0.1 mm to about 100 mm depending on the final application of the transducer array. The preferred center-to-center spacing for ultrasonic imaging arrays is about 0.2 mm to about 0.5 mm, and is about 5 mm to about 20 mm for undersea quieting applications.

The preferred actuating materials of the present invention are electrostrictive materials such as those described in above referenced U.S. Pat. No. 5,023,032, entitled "Electrostrictive Ceramic Material Including a Process for the Preparation Thereof and Applications Therefor", to Bailey et al., due to their high strain, low hysteresis, and tuneable sensitivity. This preferred material is a lead magnesium niobate-lead titanate (PMN-PT) solid solution system which is doped with small weight percentages of barium titanate (BT) and/or strontium titanate (ST). The PMN-PT-(BT/ST) solid solution has been found to have optimal actuating characteristics between about 0° C. and about 60° C. Other suitable materials include PZT-8 (drivers), PZT-5H (drivers, sensors), and many others known to those skilled in the art.

Actuators 14 may also have a multitude of configurations such as rods, sheets and the like, with the preferred actuator configuration being a multilayer design. In the multilayer design, actuators 14 have a plurality of alternating and juxtaposed layers of active material 22 and internal conductive material layers 18 which are mechanically connected in series and electrically connected in parallel. Each active material layer 22 is disposed between two electrode layers 18a and 18b, one of positive potential and one of negative potential to create a plurality of "stacked sandwiches". To electrically connect each of the plurality of electrode layers to the power source, there are two side conductive layers 20a and 20b disposed on two sides of actuator 14. One side layer 20a carries a positive potential field to a plurality of alternating internal electrode layers 18a and another side layer 20b carries a negative potential to the other plurality of the alternating, remaining internal electrode layers 18b. Side conductive layers 20a and 20b are electrically connected to electronics subportion 28 by electrical connection with bond pads 16 which in turn are electrically connected to conductive leads 24, conductive vias 25 and the like. Internal conductive layers 18a and 18b and side conductive layers 20a and 20b may comprise a broad class of conductive materials capable of surviving the actuator processing techniques. Examples are platinum, a eutectic material comprising gold/palladium/platinum, and a mixture of silver/palladium, with the presently preferred material being platinum. Side contacts 20a and 20b may also consist of solder or conductive polymers, such as conductive epoxies and polyamines.

Figure 2:
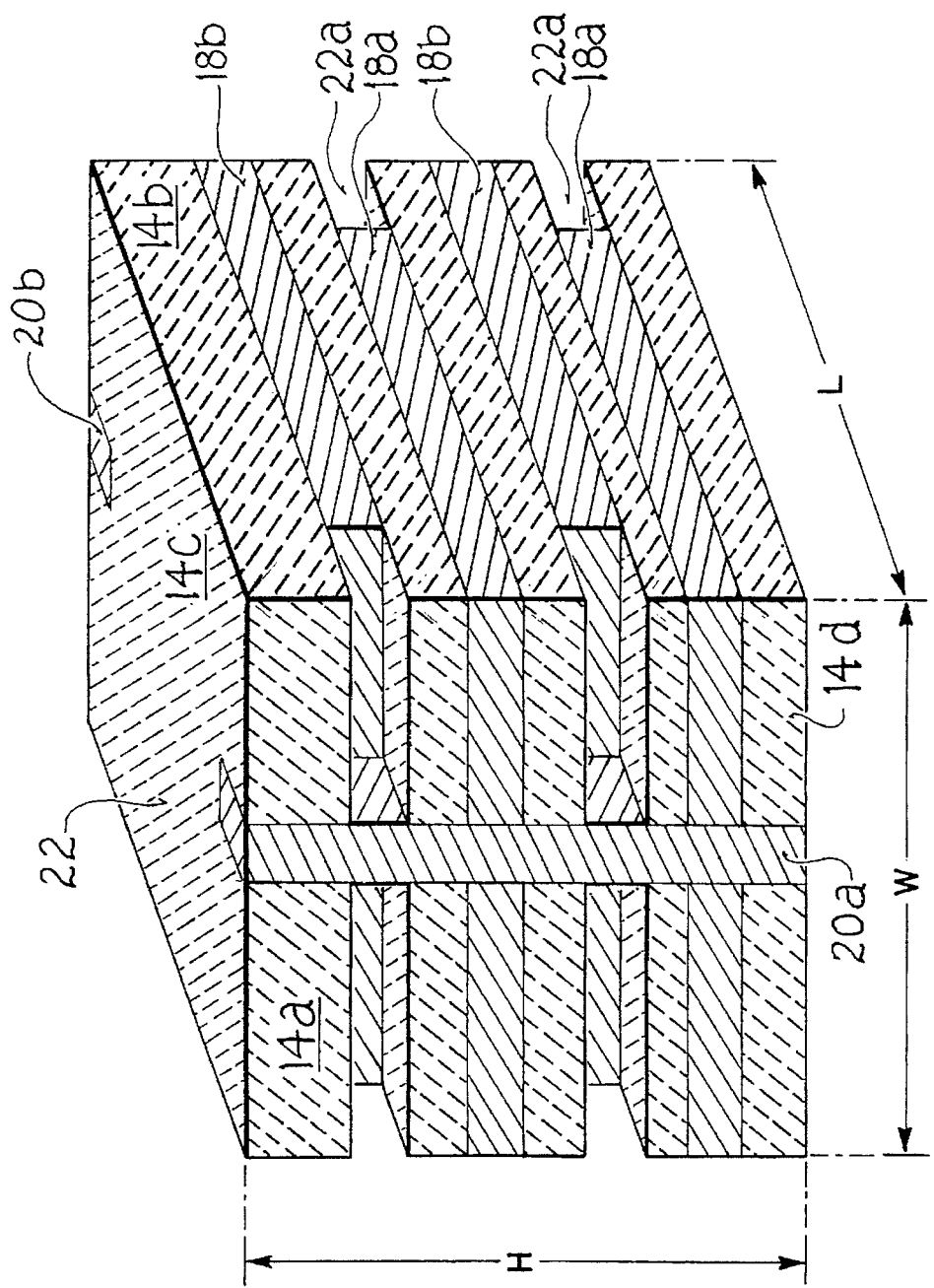
FIG. 2 is a three-dimensional perspective view of the margin actuator design.

Referring now to FIG. 2, a prior art multilayer actuator 14 having a margin design is shown in a three-dimensional perspective view. In this actuator there is a base actuator material 22 having a preselected length (L), width (W) and height (H), and a plurality of conductive layers 18a and 18b disposed therein. Conductive layers 18a and 18b, which lie in the X-Y plane, begin at alternating and opposing sides 14a or 14b (as shown extending from side 14a), optionally extend the entire width of actuator 14, but do not extend the entire length, as shown by area 22a which is devoid of any conductive layer 18a or 18b and is also devoid of any actuator material 22. Each of two side conductors 20a or 20b is disposed along at least a portion of an associated side 14a or 14b of the width of actuator 14 and extends from at least a portion of the top surface 14c to at least a portion of the bottom surface 14d. Side conductors 20a and 20b may preferably extend along a major portion of the top surface and the bottom surface, respectfully, and may cover a major portion of the sides 14a or 14b, as long as they do not create an electrical short between the positively and negatively biased layers 18a and 18b. Side conductors 20a and 20b make electrical interconnection with alternating internal conductive layers 18a and 18b, and are clearly insulated from the other conductive layers that do not extend the entire length of actuator 14, this area instead being devoid of any material. Since each side conductor 20a or 20b makes electrical contact with different and alternating internal conductive layers 18a and 18b, respectively, each layer, e.g., 18a is at an opposite potential from the layer above 18b and below 18b. Thus, when the actuator is driven, the actuating material between each pair of internal conductive layers 18a and 18b is polarized and expands. The portion of actuating material 22 disposed between a respective pair of conductive layers 18a and 18b creates the above mentioned "sandwiches" with each stacked sandwich activating simultaneously. This electrical sandwich illustrates the key aspect of the preferred multilayer actuators used in the present invention that the actuators of the present invention are electrically parallel and mechanically in series. Thus the activating dimensions of each sandwich are additive, giving the actuators used in the present invention their superior properties of providing high strain with low voltage. It should be understood that actuating occurs only in the portion of the actuator disposed between adjacent electrodes of positive and negative voltages, i.e., between two conductive layers 18a and 18b, one having a positive potential, and the other having a negative potential. Thus, if area 22a were filled with actuating material 22 it may potentially act as a clamp and inhibit the actuatuing material between layers 18a and 18b from maximum displacement.

Other actuator designs are known. One such design is to have metallization layers 18a and 18b extend the entire length of actuator 14 and have an inverse tab removed to inhibit a short circuit with side metallization layers 20a and 20b from which the internal metallization layer does not extend. Yet another design is to have metallization layers 18a and 18b extend the entire length and then place an insulative material over every other metal layer to inhibit any short circuit, e.g., place an insulative material over layers 18a on side 14b and over layers 18b on side 14a.

Although FIG. 2 shows an actuator 14 having a solid block of activating material 22 with internal conductive layers 18, the actual method of fabrication is to laminate a plurality of ceramic layers, each having an electrode printed thereon, and press the layers together to form one solid block. A general method for making the prior art margin actuators is shown in U.S. Pat. No. 4,903,166, entitled "Electrostrictive Actuators", to J. Galvagni, filed Feb. 20, 1990. This patent including all references therein is hereby incorporated in its entirety by reference herein.

The critical aspect of the preferred actuators of the present invention is that they have a multilayer design, irrespective of any specific multilayer design. These stacked multilayers may be built in a variety of designs which will be known to those skilled in the art. Each of these designs should be understood to be within the scope of the present invention. One advantage of the actuators used in the present invention is their ability to be built in a variety of lengths, widths and heights. By varying the heights, actuators 14 of varying frequency and displacement can be manufactured. For example, the actuators 14 of the present invention can have layer thicknesses between about 20 and about 200 microns which operate at voltages between about 10 and about 150 volts. Also, by changing the thickness of each layer of activating material 22 disposed between internal conductive layers 18, one may tune the impedance of actuators 14 at a desired operating frequency.

In accordance with a first aspect of the present invention, assembly 10 is designed to allow actuators 14 to be adhered to base 12 in a manner amenable to high volume microelectronic fabrication techniques. Rather than time-consuming soldering each actuator by hand, assembly 10 allows the plurality of actuators 14 to be disposed on base 12 with standard integrated circuit (IC) processing techniques. For example, actuators 14 may be delivered on a roll of tape. The roll of tape is placed onto a standard pick-and-place machine which removes each actuator individually and places it onto the bond pads 16 of base 12. While the pick and place machine holds the actuator in place, another instrument solders each actuator 14 to chip pads 16. The soldering can be accomplished by a standard technique such as reflow soldering in which the pads 16 are first pre-coated with a solder paste, and adhering side conductors 20a and 20b to pads 16 is effected by heating the entire base or by local heating (e.g., with a laser) until the solder flows. Thus, interconnection between chip pads 16 and side conductive layers 20a and 20b is completed in an extremely efficient manner. The above example is for illustration only—many modifications may be made by those skilled in the art.

Referring again to FIG. 1, once the plurality of actuators 14 are disposed on base 12 and electrically connected to electronics subportion 28, they may optionally be encased in a protective material 26. Protective material 26 can be any insulative material which encases the plurality of actuators 14 and which does not interfere with the motion or sensing of actuators 14. Acceptable materials are polyurethanes, rubbers, woven fiber/rubber composites, polymer composites or epoxies. Preferred materials are those which do not absorb at the working frequencies of assembly 10, such as "RTV®" brand of silicone compound, made by General Electric in Waterford, N.Y. Along with protecting assembly 10, protective material 26 has the added advantage of decoupling any actuation in the X or Y axes (while the actuator has an electric field applied in the Z axis), from the actuation in the Z axis (while having a Z axis field), thereby enhancing the receive response figure of merit for the transducer array 10. Assembly 10 may optionally have a rigid member 29 disposed on a top surface of protective material 26 to provide further protection of actuators 14 and protective material 26.

FIG. 3a shows a plurality of actuators 14 arranged in a two-dimensional array, with each labeled for its respective place in the X and Y axes (e.g., 1,1 through 3,3) and each actuator 14 individually addressed by electronics subportion 28. As such, each actuator 14 can "fire", or be caused to actuate individually, by means of an electric current sent by electronics subportion (not shown). And since each actuator 14 can also work as a sensor, it can also sense an incoming force individually and produce an electric current which is subsequently processed by electronics subportion 28. Assembly 10 may optionally include sensors 17 placed in the interstices of the array of actuators 14 for additional sensing capabilities beyond what actuators 14 can provide. For example, there may be fiber optic sensors, thermocouple sensors, magnetic sensors or another type of actuator/sensor material from actuators 14. Sensors 17 that produce an electrical pulse from their sensing, such as thermocouples, will be interconnected in a manner similar to actuators 14. Sensors 17, such as fiber optic sensors that sense strain, can be inserted into assembly 10 in a variety of ways which will be known to those skilled in the art. Sensors 17 may also be individually interconnected to electronics subportion 28 such that this information may be compared with the information coming from actuators 14.

In accordance with a second aspect of the present invention, assembly 10, with integrated electronics subportion 28, is made a "smart assembly," in several respects for use in the medical imaging field, underwater noise cancellation field and the like: first with actuators acting as drivers; second with actuators 14 acting as sensors; and finally with actuators acting both as drivers and sensors. With actuators addressed individually, electronics subportion 28 can "fire" actuators 14 individually in a manner designed to steer a beam of acoustic energy in any direction. To produce the steered acoustic beam in the active (transmission) mode, electronics subportion 28 causes individual actuators, or groups of actuators (e.g., rows or columns) to be activated in a timed sequence, causing development of an acoustic wavefront traveling in the desired direction. For example, actuator designated 1,1 in the Cartesian coordinate system may be driven at a time interval T=0, followed by actuators 1,2 and 2,1 driven at a time interval T=1, with actuators 1,3, 2,2 and 3,1 driven at a time interval T=2. This timed delay of driving the plurality of actuators will create a wavefront which may be steered at a 45 degree angle to the X and Y axes. However, it should be understood that actuators can be fired in a timed sequence to steer a wavefront in any direction.

Acting as a sensor or receiver, "smart" assembly 10 can calculate the direction from which an acoustic signal originated. The direction can be calculated by having electronics subportion 28 measure the time at which each actuator 14 is acted upon by an incoming wavefront. For example, if a wavefront impacts actuators 1,3, 2,2 and 3,1 at time interval T=0, followed by impacting actuators 1,2 and 2,1 at a time interval T=1 and finally impacting actuator 1,1 at time interval T=2, electronics subportion 28 would calculate a wavefront incoming at a 45 degree angle to the X and Y axes. However, it should be understood that electronics subportion 28 can time the receiving of a wavefront on the individual actuators to calculate the direction of an incoming wave in any direction in the X-Y plane. Electronics subportion 28, integrated with assembly 10, can also calculate the frequency of incoming acoustic energy by Fourier transform of the time dependence of the individual actuator/sensor 14 voltage signals. The sensitivity of electrostrictive actuators 12, used in one embodiment of assembly 10 of the present invention, may be electrically tuned (both in amplitude and sign) by adjusting the DC bias voltage across each actuator 14. The sensitivities can, therefore, be adjusted in a spatially periodic manner across assembly 10 to match a certain known waveform. This enables assembly 10 to be selective for that waveform, and further allows assembly 10 to be switchable to another waveform (within the RC time constant of the circuit).

Integrated smart assembly 10 can also utilize actuators 14 in both the driving and receiving mode in a coordinated fashion to actively determine the direction of a nearby object by echo ranging. Actuators 14 of assembly 10 can be fired substantially simultaneously, or alternatively can be steered as described above, to create a wavefront traveling away from assembly 10. This wavefront will impact nearby objects and a portion of the wavefront will reflect off from the object. Assembly 10, acting in the receiving mode, impacted by the reflected wavefront will detect the reflection and, with integrated electronics subportion 28, calculate its direction. Another example of how assembly 10 can utilize actuators 14 in both the driving and receiving mode in a coordinated fashion is when an incoming signal is selected to be canceled. Typically, when an incoming signal impinges upon assembly (or the structure to which assembly is attached), a portion of the signal will reflect off and may be detected by a remote sensor. However, "smart assembly" 10 of the present invention can detect both the direction and frequency of an incoming wavefront, and additionally, can either cancel or redirect the reflected acoustic energy by driving the actuators in an electronically calculated fashion. Assembly 10 may cancel an incoming signal by having actuators 14 and/or sensors 17 sense an incoming signal which is then processed by electronics subportion 28. Electronics subportion 28 then sends a signal to actuators 14 which send out another signal that is 180 degrees out of phase with the incoming signal, thereby effectively canceling any portion of the incoming signal that would have reflected off from the structure to which assembly 10 is attached.

FIG. 3b shows a plurality of actuators 14 being addressed in blocks. As such, the group of actuators will "fire" together. One electronic advantage to firing the transducers in group is that assembly 10 can be "tailored" for a given frequency or frequency range. For example, assuming array 10 includes actuators with dimensions of approximately 5 mm (W) by 5 mm (L) and 5 mm spacing, then, if assembly 10 is designed to be selectively tuned to wavelengths in the 10 to 30 centimeter range, better acoustic performance can be obtained by driving a plurality of blocks (e.g., 10 by 10 sub-arrays) because the radiation impedance is higher. If only one dimensional directionality is needed, actuators 14 are best addressed in columns (e.g., 1 by 10 sub-arrays). It should be understood that the actual design and addressing scheme will vary from application to application, known to those skilled in the art, and that the assembly 10 of the present invention allows one the flexibility to cover a wide variety of options.

In accordance with a third aspect of the present invention, assembly 10 allows flexible design capability while at the same time maintaining electronic integration. As stated above, it is very difficult to integrate both a plurality of actuators and electronics subportion 28 into a compact assembly. However, the present invention not only allows this integration, but also allows assembly 10 to be tailored for one of a number of specific functions through various fabrication modifications. For example, because the present invention implements multilayer actuators, they can be fabricated with a multitude of heights—each height being sensitive to a specific frequency range. Also, as stated above, this fabrication design for actuators 14 also allows the impedance to be varied simply by varying the thickness of each layer of actuating material before stacking and firing the green ceramic material. Furthermore, the volume percent of actuators 14 disposed on base 12 may be varied. This not only allows assembly 10 to be tailored for specific frequency sensitivities, e.g., low, mid or high frequency, but also for different impedance characteristics. Assembly 10 has a wide range of operating frequencies. For example, the preferred actuators of the present invention have strains which range from about 800 ppm to about 1000 ppm and a hysteresis below about 2 percent. They have a frequency range from D.C. to the megahertz range, and a mechanical energy density up to about 6000 joules per cubic meter.

Referring to FIG. 4, a presently preferred embodiment of a microcomposite transducer array 110 is shown. A high density interconnected microcomposite transducer array 110 has a substrate 112 with a plurality of chip cavities 113 formed therein, through a top surface 112a thereof. An electronic component 116 such as an integrated circuit chip and the like, is disposed in each chip well 113. Electronic components 116 may be bonded to the substrate 112 with a layer of a thermoplastic adhesive 114. The electronic components 116 have pads 116a on an upper contact surface 116b thereof. A high density interconnect structure 117 is fabricated above chips 116 by laminating a first dielectric layer 118. First dielectric layer 118 may optionally have separate lower and upper sublayers (not shown). Dielectric layer 118 supports a patterned metallization layer 119 which makes electrical contact with at least some of contact pads 116a on substrate 112 through via holes 120 disposed in dielectric layer 118.

Next, a second dielectric layer 121 is laminated over first dielectric layer 118. Second dielectric layer 121 supports a patterned metallization layer 122 which extends through via holes 123 to make electrical contact with first metallization layer 119. Third and fourth dielectric layers (124 and 127, respectfully) each supporting a metallization layer (125 and 128, respectfully) may be built upon second dielectric layer 122, with each dielectric layer having via holes (126 and 129, respectfully) disposed therein to allow electrical contact with the next lower metallization layer.

Once the high density interconnect structure 117 is completed, actuators 130 are bonded to the upper-most dielectric layer (dielectric layer 127 in FIG. 4). As discussed above, actuators 130 can be easily electrically connected to module 110 through standard IC processing techniques, e.g., pick-and-place machines. Again, actuators 130 may optionally be bonded, preferably with an epoxy adhesive 133, to maximize the "up" motion upon actuation. Also, electrical contact must be made between the side conductor tabs 132a and 132b and the uppermost metallization layer 128. One portion 128a of metallization layer 128 carrying a positive potential is electrically connected to one side conductor 132a and another portion 128b of metallization layer 128 carrying a negative potential is electrically connected to the other side conductor 132b. Each actuator may be individually addressed by the integrated electronics subportion 28, or actuators 130 may be addressed in blocks. Once the plurality of actuators 130 are disposed on the upper-most dielectric layer (layer 127 in FIG. 4), and electrically connected to electronic components 116, they may optionally be encased in a protective material 136, which is substantially identical to protective material 26 described hereinabove. High density interconnected microcomposite transducer array 110 may optionally have a rigid member 139 disposed on a top surface of protective material 136 to provide further protection to actuators 130 and protective material 136.

Depending on the needs for multi-chip module 110, actuators 130 may have a multitude of designs (see FIGS. 3a and 3b), and as stated above may also vary in height. The combination of high density interconnect technology with multi-layer actuators allows the electronics to be integrated into the smart material in an extremely small package, and further allows extremely close packing of actuators 130 while maintaining individual addressing of each actuator. Assembly 110 has similar operating characteristics and advantages to assembly 10 described hereinabove, except that assembly 110 allows for tighter packing of actuators 130, and additionally allows for tighter packing of the electronics.

While the invention is described herein in some detail, many modifications and variations will become apparent to those skilled in the art; it is our intent to be limited only by the scope of the appending claims, and not by the specific details or instrumentalities present herein by way of description of the preferred embodiments(s).

What is claimed is:

1. An integrated, tunable, impedance-controllable and electronically addressable composite transducer assembly, comprising:

(a) a base;

(b) a plurality of multilayer actuators disposed on said base and forming a transducer array, each of said plurality of actuators having a plurality of alternating and juxtaposed layers of active material layers and internal conductive material layers which are electrically connected in parallel and mechanically connected in series and having a top surface and a bottom surface, where said plurality of actuators convert electrical energy to mechanical motion and reciprocally convert mechanical motion to electrical energy;

(c) a protective material encasing said plurality of actuators; and (d) electronic means, being integrally connected to said base, and electrically connected to said plurality of actuators, for electrically measuring said electrical energy produced by said plurality of actuators and for producing electrical input to cause said plurality of actuators to move; and wherein each actuator is individually fabricated to have a particular, selectable height, length, width, configuration, and a particular, selectable layer thickness; and wherein each actuator is disposed on said base at a particular, selectable location; and wherein each actuator has a particular, selectable direct current bias applied by said electronic means and a particular, selectable addressing applied by said electronic means;

so that the transducer array is tunable and impedance-controllable and electronically-addressable for selected operating frequencies and spatial configurations and directions of waveform beams of acoustic energy.

2. The integrated composite transducer assembly of claim 1, wherein said plurality of actuators are disposed on said base in a two-dimensional arrangement having rows and columns.

3. The integrated composite transducer assembly of claim 2, wherein said base is a material selected from the group consisting of ceramics, polymers, and composites.

4. The integrated composite transducer assembly of claim 3, wherein said base is a printed circuit board.

5. The integrated composite transducer assembly of claim 1, further comprising a top rigid structure overlying said plurality of actuators.

6. The integrated composite transducer assembly of claim 2, wherein said electronic means is electrically connected to said plurality of actuators individually.

7. The integrated composite transducer assembly of claim 2, wherein said electronic means is electrically connected to said plurality of actuators in blocks.

8. The integrated composite transducer assembly of claim 2, wherein said electronic means comprises a high density interconnected multichip module and where said high density interconnected module replaces said base.

9. The integrated composite transducer assembly of claim 2, wherein said actuators comprise a material selected from the group consisting of electrostrictive, piezoelectric, and magnetostrictive.

10. The integrated composite transducer assembly of claim 9, wherein said actuators have a height between about 0.1 mm and 20 mm, a length between about 0.1 mm and about 10 mm, and a width between about 0.1 mm and about 10 mm.

11. The integrated composite transducer assembly of claim 10, wherein said actuators in said assembly are spaced about 0.1 mm to about 100 mm from adjacent actuators.

12. The integrated composite transducer assembly of claim 9, wherein a plurality of sensors are placed in predetermined ones of the plurality of interstices between said actuators, and where said sensors comprise a selected one of the group consisting of fiber optic sensors, thermocouple sensors, actuators, electromagnetic sensors, and electrostatic sensors.

13. An integrated tunable, impedance-controllable and electronically-addressable composite transducer array, comprising:

(a) a base;
(b) a plurality of actuators disposed on said base, each actuator having a top surface and a bottom surface, as well as a length, width and height, each of said plurality of actuators further comprising a multilayer construction having
 (i) two side layers of conductive material disposed on at least a portion of opposing sides of said actuator and extending from at least a portion of said top surface of said actuator to at least a portion of said bottom surface of said actuator;
 (ii) an internal layer of actuating material extending the length, width and height of said actuator and internal to said top, bottom and side conductive layers;
 (iii) a plurality of alternating internal conductive layers extending the width of said actuator and each alternating layer extending from a different one of said two side conductive layers than a next lower internal conductive layer and a next higher internal conductive layer, each of said plurality of alternating internal layers extending across at least a major portion of said length of said actuator but not making electrical contact with the other of said two side conductive layers from which each respective said plurality of internal conductive layers extends; and wherein said plurality of actuators will actuate in response to electrical input and will produce electrical energy when acted upon by incoming acoustic energy; and (c) electronic means electrically connected to said plurality of actuators for electrically measuring said electrical energy when said plurality of actuators are acted upon by incoming acoustic energy and for producing electrical input to cause actuation of said actuators and wherein each actuator is individually fabricated to have a particular, selectable height, length, width, configuration and a particular, selectable layer thickness; and wherein each actuator is disposed on said base at a particular, selectable location; and wherein each actuator has a particular, selectable direct current bias applied by said electronic means and a particular selectable addressing applied by said electronic means;

so that the transducer array is tunable and impedance-controllable and electronically-addressable for selected operating frequencies and spatial configurations and directions of waveform beams of acoustic energy.

14. The composite transducer array of claim 13, where said transducer array is used in medical imaging.

15. The composite transducer array of claim 13, where said transducer array is used in underwater noise cancellation.

16. The composite transducer array of claim 13, wherein said electronic means comprises a high density interconnected multichip module and where said high density interconnected module replaces said base.

17. A high density interconnected, tunable, impedance-controllable and electronically-addressable composite transducer assembly, comprising:

a substrate having a top surface and at least one chipwell disposed therein;

a plurality of electronic components disposed in said at least one chipwell, at least some of said electronic components being integrated circuit chips having chip pads disposed thereon;

high density interconnecting means disposed over said substrate and plurality of electronic components for electrically interconnecting said electronic components;

a plurality of multilayer actuators each having a plurality of alternating and juxtaposed layers of active material layers and internal conductive material layers which are electrically connected in parallel and mechanically connected in series and being disposed on an upper surface of said high density interconnecting means and connected to said electronic components by said interconnecting means; and a protective material disposed over and around said actuators for encapsulation; and wherein each actuator is individually fabricated to have a particular, selectable height, length, width, configuration, and a particular, selectable layer thickness; and wherein each actuator is disposed on said high density interconnecting means at a particular, selectable location; and wherein each actuator has a particular, selectable direct current bias applied by said plurality of electronic components and a particular, selectable addressing applied by said plurality of electronic components;

so that the transducer assembly is tunable and impedance-controllable and electronically-addressable for selected operating frequencies and spatial configurations and directions of waveform beams of acoustic energy.

18. The integrated composite transducer assembly of claim 17, wherein said actuators comprise a material selected from the group consisting of electrostrictive, piezoelectric, and magnetostrictive.

19. The high density interconnected composite transducer assembly of claim 17 where said plurality of actuators are individually addressed and are disposed in a two-dimensional arrangement and each actuator being spaced from adjacent actuators by about 0.1 mm to about 100 mm.

20. The high density interconnected composite transducer assembly of claim 17 where said actuators where said actuators have a height between about 0.1 mm and 20 mm, a length between about 0.1 mm and about 10 mm, and a width between about 0.1 mm and about 10 mm.

21. The composite transducer array of claim 19, where said transducer array is used in medical imaging.

22. The composite transducer array of claim 19, where said transducer array is used in underwater noise cancellation.

* * * * *